(12) United States Patent
Bula et al.

(10) Patent No.: US 6,627,361 B2
(45) Date of Patent: Sep. 30, 2003

(54) ASSIST FEATURES FOR CONTACT HOLE MASK PATTERNS

(75) Inventors: Orest Bula, Shelburne, VT (US); Michael S. Hibbs, Westford, VT (US); Steven J. Holmes, Milton, VT (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 09/901,241

(22) Filed: Jul. 9, 2001

(65) Prior Publication Data

US 2003/0008216 A1 Jan. 9, 2003

(51) Int. Cl.[7] .............................. G03F 9/00; G03F 7/00; H01L 21/00
(52) U.S. Cl. ............................. 430/5; 430/30; 430/322; 430/396
(58) Field of Search .................. 430/30, 313, 322, 430/396

(56) References Cited

U.S. PATENT DOCUMENTS

| | | | |
|---|---|---|---|
| 5,955,222 A | | 9/1999 | Hibbs et al. .................. 430/5 |
| 6,007,968 A | * | 12/1999 | Furukawa et al. .......... 430/314 |
| 6,022,644 A | * | 2/2000 | Lin et al. ....................... 430/5 |
| 6,077,633 A | * | 6/2000 | Lin et al. ....................... 430/5 |
| 6,114,082 A | | 9/2000 | Hakey et al. ............. 430/270.1 |

* cited by examiner

Primary Examiner—Mark F. Huff
Assistant Examiner—Kripa Sagar
(74) Attorney, Agent, or Firm—Whitham, Curtis & Christofferson, P.C.; Richard M. Kotulak

(57) ABSTRACT

An assist feature is formed on a lithographic reticle or mask using a hybrid resist and an exposure dose such that only an annular area is effectively exposed having a width that is potentially less than the minimum feature size that can be resolved by the mask exposure tool to simultaneously or sequentially form both a feature of interest and an assist feature for enhancing imaging of the feature of interest when the feature is printed to a wafer. Since the assist feature can be imaged simultaneously with the feature of interest or multiple assist features imaged concurrently, possibly between closely spaced features, data volume and mask writing time are greatly reduced. The invention is particularly applicable to the scaling of contact holes for connections to active devices in extremely high density integrated circuits.

17 Claims, 2 Drawing Sheets

ASSIST FEATURES FOR CONTACT HOLE MASK PATTERNS

BACKGROUND OF THE INVENTION

1. Field of the Invention

The present invention generally relates to lithographic processes for manufacture of semiconductor integrated circuits and, more particularly, to production of assist features on lithographic reticles and masks.

2. Description of the Prior Art

The potential for improved performance and functionality of integrated circuits as well as potentially increased manufacturing economy has led to designs utilizing extremely small feature size regimes and much increased integration density. While numerous advances in semiconductor technology have allowed electronic devices to be fabricated at smaller sizes and in increased numbers and proximity on a chip while maintaining electrical characteristics, many gains in integration density have been achieved through scaling of existing device designs to smaller sizes, implying reduced dimensions of components of devices (e.g. gate insulator thicknesses and channel lengths and widths), operation at lower voltages and the like.

While semiconductor processing techniques have become very sophisticated and allow fabrication of some structures much smaller than can be resolved in a lithographic exposure, the location and basic dimensions of any device in an integrated circuit must be patterned lithographically. Therefore, lithographic resolution of a given exposure tool generally limits the integration density and minimum feature size that can be achieved. Conversely, lithographic exposures for integrated circuit manufacture generally include features which approach resolution limits of the exposure tool. For this reason, different exposure media (e.g. I-line, deep ultra-violet light, electron beams and X-rays have been used to increase available resolution. Further, masks have been developed including so-called assist features in order to enhance resolution.

For example, one known assist feature employs varying thickness of transparent features to cause phase shift in the light used to illuminate regions of the target such that an interference pattern is developed. The interference pattern causes increased rate of change of exposure dose at the perimeter of features to allow features to be exposed with enhanced sharpness and resolution.

Another image enhancement technique is off-axis illumination (OAI) which functions by excluding exposure illumination from the center of the pupil and thus emphasizes the aerial image information toward the edges of the pupil. OAI can be used to enhance the resolution and depth of focus process latitude for arrays of closely nested patterns. Isolated patterns are often not enhanced by OAI. As a result, it is often desirable to place sub-resolution assist features (SRAF) adjacent to isolated product patterns. These SRAF structures enhance the process latitude for isolated features by making them behave like nested features in the exposure process while the SRAF are too small to actually form a separate pattern on the substrate.

To achieve high integration density, it is necessary to place connections at different levels in the integrated circuit structure than the levels at which active or passive devices are formed. Therefore, connections to the devices are generally made vertically through contact holes to respective portions (e.g. gate, source and drain) of each device. Contact holes may also be used to make connections between wiring layers. However, known resolution enhancement techniques are only applicable to singular small features such as contact holes to allow scaling of contacts as the devices themselves are scaled to smaller sizes with substantial difficulty in reticle formation and with limited success.

More specifically, attempts to provide assist features have presented several problems. For example, assist features must, by their nature, generally be quite small (to prevent printing of the assist feature, while enhancing resolution of the intended feature) and often ideally less than the minimum feature size of the ground rules of the integrated circuit design being fabricated. While such reduced sizes are possible through demagnification of the mask pattern during lithographic exposures (except for the use of X-rays where a contact mask must be employed), formation of assist features of ideal size and placement in a mask may compromise reliability of manufacture of the mask, itself, leading to a likelihood of increased costs due to loss of mask manufacturing yield.

Perhaps more importantly, approaches using numerous discrete assist features, such as an array of mask apertures to create a contact hole, that have been employed, provide resolution of images which is of less than desired quality since resolution increases with the number of assist features but the number of assist features is generally limited by practical considerations. For example, the number of assist features which must be separately written to the mask greatly increases mask pattern writing time and thus increases mask costs. Further, the data involved may approach or exceed mask writer capacity. Moreover, the area required for such assist features may also exceed the area that can be accommodated in masks for devices having very high integration density since features that may not be substantially nested may still be sufficiently proximate that the areas ideally required for SRAF structures may overlap or interact.

Thus, assist features comprising arrays of mask apertures can only be used to form a contact hole where the contact hole is isolated from other features. Accordingly, the use of conventional assist features for production of contact holes may severely complicate integrated circuit layout and is not applicable to the majority of circumstances where contact holes are needed (e.g. to contact different parts of, for example, a transistor of small dimensions).

SUMMARY OF THE INVENTION

It is therefore an object of the present invention to provide an assist feature of small footprint in a mask which is capable of scaling contact holes to sizes comparable to feature sizes obtainable with optical lithography.

It is another object of the invention to provide a method of making a mask including assist features which are of reduced footprint and provide improved contact hole exposures.

It is a further object of the present invention to provide reduction of pattern data and lithographic writing time in reticle manufacture.

In order to accomplish these and other objects of the invention, an exposure pattern for a mask feature for lithographic patterning of a contact hole is provided comprising an illuminated annulus having a sub-resolution width including an inner edge for producing an intermediate level of illumination in a pattern area and an outer edge for producing an intermediate level of illumination of an assist feature separated from said pattern area. The assist feature may surround a pattern area such as a contact hole or be adjacent an elongated side of an elongated feature or between adjacent elongated features. The sub-resolution assist features may be provided for all or less than all pattern areas or even one or more particular portions of a pattern area.

In accordance with another aspect of the invention, a method of making a lithographic mask is provided including steps of exposing a hybrid resist with an annular pattern having sub-resolution width, and developing the hybrid resist to form openings corresponding to a pattern area and an assist feature spaced from the pattern area.

In accordance with a further aspect of the invention, a method of forming an integrated circuit is provided including steps of exposing a resist with a pattern including a feature corresponding to a pattern area of approximately minimum feature size and a sub-lithographic assist feature formed using a hybrid resist spaced therefrom and completing the integrated circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
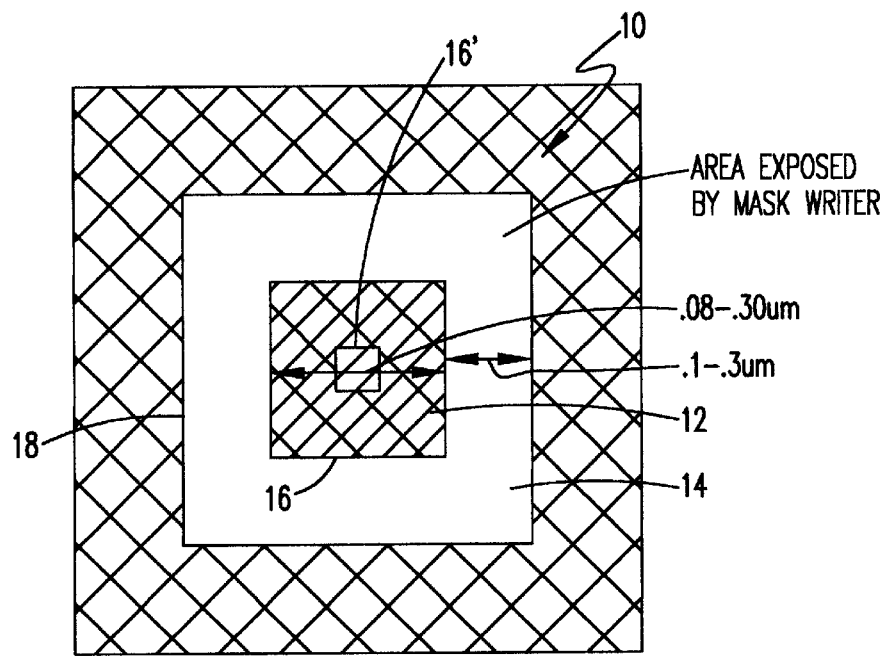
FIG. 1 is a plan view of an exemplary lithographic exposure pattern for patterning of a mask in order to lithographically expose a contact hole in accordance with the invention.

Referring now to the drawings, and more particularly to FIG. 1, there is shown, in plan view, an exemplary pattern 10 for exposure of a resist on a mask substrate for lithographic production of a contact hole with a further exposure of a resist layer using the mask. While a square shaped feature is somewhat preferred and thus illustrated in FIG. 1 for clarity and simplicity of production using available mask writing tools, the particular shape is not important to the successful practice of the invention in accordance with its basic principles.

It should be understood that the pattern 10 of FIG. 1 is intended for exposure of a hybrid resist such as that disclosed in detail in U.S. Pat. No. 6,114,082 to Hakey et al. assigned to the assignee of the present invention and hereby fully incorporated by reference. In essence, a hybrid resist, as disclosed therein, includes both positive and negative resist materials providing positive and negative tone responses, respectively. By doing so, unexposed and fully exposed areas are not developed and only resist areas receiving an intermediate exposure dose are removed during development. That is, only a relatively narrow range of exposure dose will result in effective exposure of a hybrid resist. Such hybrid resists are available for all exposure media, including electron beams and also generally provide higher resolution than normal positive or negative resists.

These properties of a hybrid resist can be exploited to develop patterns of parallel lines at double the spatial frequency of the exposure or closed geometric shapes by effects of the edges of the exposure pattern (possibly including interference pattern effects) where the exposure intensity is reduced to an intermediate level. For example, an electron beam aerial image has a Gaussian intensity distribution similar to an optical aerial image due to a combination of effects possibly including variations in focus, variation in electron energy and Coulomb interactions and scattering. Therefore there is significant variation in intensity at the edges of the electron beam and patterned portions thereof. Lower intensities trigger the positive tone response of the hybrid resist while higher intensities trigger the negative tone response. The width of the developed space in the hybrid resist (often referred to as a hybrid space) is established by the variation in beam intensity at the edge of the exposed area.

The intermediate exposure dose which will cause development of a hybrid resist can be obtained in several ways such as by the natural dispersion of the E-beam or optical beam, or by fusing together two adjacent edges that are placed in close proximity on the reticle substrate (as in FIG. 1); causing overlapping of edges of the exposure beam in a localized area. However, geometric shapes that are not closed require additional masking and exposure processes to suppress process artifacts (e.g. extra lines) at the sides or terminations of arrays of parallel lines. That is, the hybrid resist, being a resist that prints openings around the edges of exposed regions, will tend to form closed loops on the substrate. If it is desired to pattern geometric shapes that are not closed shapes with this type of resist, additional masking and etching steps may be required.

Assist features have not generally been used because it is often difficult to pattern them at sub-resolution dimensions and it is often also difficult to design their placement around the shapes for which enhancement is intended. The hybrid resist provides an advantage in that it forms at sub-resolution dimensions and it automatically forms around each drawn shape without the need for additional design efforts or data handling needs in the computer that operates the mask writing tool.

Specifically, it has not been possible to produce assist features at sufficiently small sizes which do not produce artifacts that effectively defeat the production of small, singular features or prevent the use of sufficient numbers of assist features for producing desired resolution. A problem with making assist features on masks has often been that there is not sufficient room to include the assist feature(s) between adjacent pattern shapes. In order to make room to add the assist feature, it would be necessary to increase the separation between adjacent pattern shapes. In doing so, the product pitch would be accordingly increased which reduces the integration density of the devices in the circuit; contrary to the desirability of maximizing integration density of the devices in order to reduce costs and improve circuit performance. The method of fabricating sub-resolution assist features (SRAF) allows assist features to be placed adjacent to pattern features at a smaller pitch than conventional approaches; enhancing the pattern density of the product.

The mask exposure pattern of FIG. 1 is essentially an annulus 14 having its center dimensions and its width determined in accordance with the exposure medium intended for a subsequent resist exposure, the feature size regime of the design to be manufactured and the writing program of the reticle fabrication tool or mask writer. Generally, the central (unexposed) feature 12 will preferably have a transverse dimension of from 0.08 to 0.3 $\mu$m and the surrounding exposed annulus will have a width of about 0.1 to 0.3 µm (referenced to the 1×scale of the substrate on which the patterns are being printed, such as a mask which is often 4×larger than the pattern dimensions on a wafer to be exposed). These dimensions are not critical to the successful practice of the invention and can be varied beyond these ranges in partial dependence on the exposure medium. However, the overall size of the pattern of FIG. 2 resulting therefrom must generally be less than about 1.0 µm, again, depending on the exposure medium to be used, in order to achieve effects of an assist feature of developing relatively sharp gradients in illumination intensity. In general, assist features do not aid the process window for structures larger than 0.3 µm for DUV or 193 nm radiation or about 0.45 for I-line (about 365 nm wavelength) exposure systems.

Figure 2:
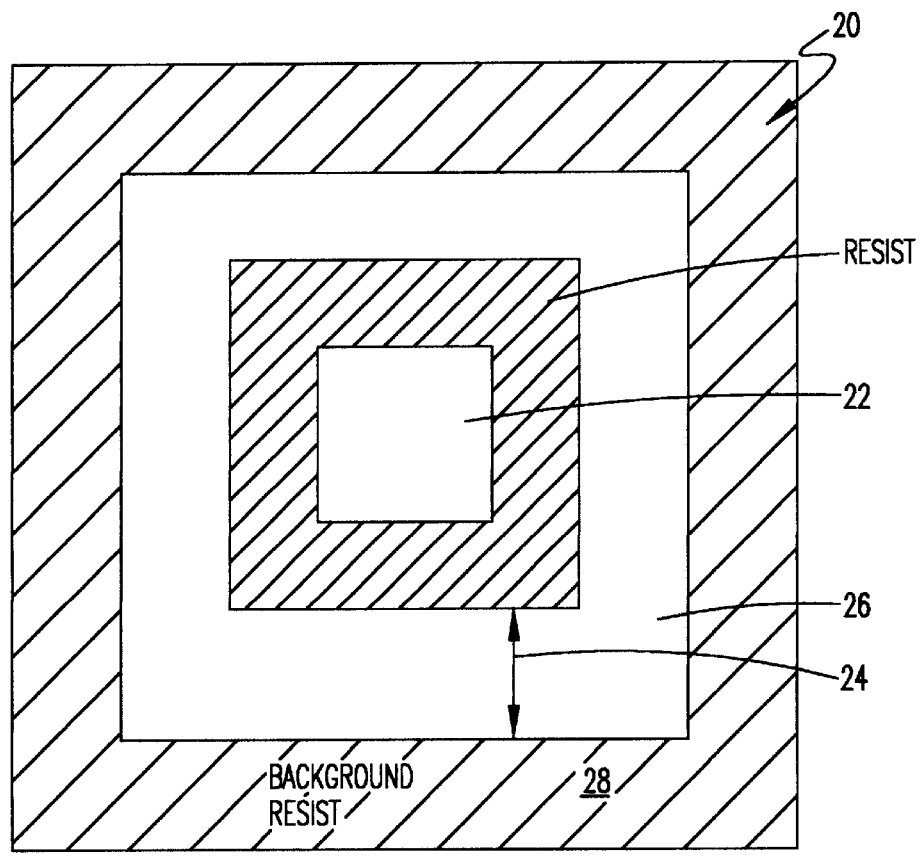
FIG. 2 is a plan view of a mask pattern for exposure of a contact pattern provided by the mask exposure of FIG. 1.

Such a mask exposure pattern, when used with a hybrid resist and appropriate (empirically determinable) exposure dose will print a contact hole feature with an assist feature surrounding the contact hole feature and separated therefrom by a narrow space; an exemplary form of which, corresponding to the exposure pattern of FIG. 1, is shown in FIG. 2. The width of the separation 24 of the contact hole feature 22 and the assist feature 26 is largely determined by the width of the exposed annulus but may be somewhat affected by diffraction or electron scattering effects. Preferred dimensions 26 (FIG. 2) are 0.07 µm for subsequent e-beam exposure, 0.06–0.18 µm for subsequent DUV exposure and 0.25–0.4 µm for subsequent I-line exposure.

These sizes are unrelated to the dimensions 24 of FIG. 2 and refer to the sizes of openings 26 in FIG. 2 which can be readily achieved with a hybrid resist when patterned with E-beam, DUV or I-line irradiation, respectively. The optimum size of 24 in FIG. 2 would be approximately 0.05 µm to 0.20 µm, depending on the size and pitch of contact holes being patterned. The distance 24 is not determined by the hybrid resist but by the mask writing tool.

The printing of such a pattern 20 results from the exposure of a hybrid resist with the pattern of FIG. 1 since an intermediate dose will occur at each edge of the pattern. That is, the central unexposed feature 12 would, after baking and development processes appropriate to the resist materials, produce an aperture or transparent area in the mask due to the intermediate exposure dose corresponding to the inner edge 16 of the exposed annulus which causes exposure of the contact hole area 22 while the outer edge 18 of the exposed annulus 14 provides an intermediate exposure dose that forms the assist feature 26. Line 24 is formed by the negative tone response of the hybrid resist to an increased exposure dose. The remainder of the resist 28 surrounding the mask pattern is unaffected and remains as background resist 28. The mask feature, itself, can then be produced in accordance with the chosen materials of the reticle using processes well-understood by those skilled in the art.

The dimensions of contact hole 22 are preferably about twice the preferred dimension 26 since contact hole 22 is formed by fusing together two adjacent hybrid spaces such as 26. If it is desired to make the dimension 22 larger than twice the dimension 26, it may be necessary to add some partial exposure areas inside area 12 (FIG. 1). That is, while the above exemplary dimensions of the mask pattern and exposed regions of a wafer are preferred as a particularly useful and important application of the invention, the principles of the invention are readily applicable to larger pattern areas by the simple expedient of providing an additional exposure region 16' on the mask. It may be desirable or possibly necessary, depending on desired dimensions to expose region 16' with a reduced exposure dose to avoid printing the negative tone response of the hybrid resist. However, feature 16' could be formed in other ways which will be apparent to those skilled in the art in light of this discussion of the invention and its basic principles.

Figure 3:
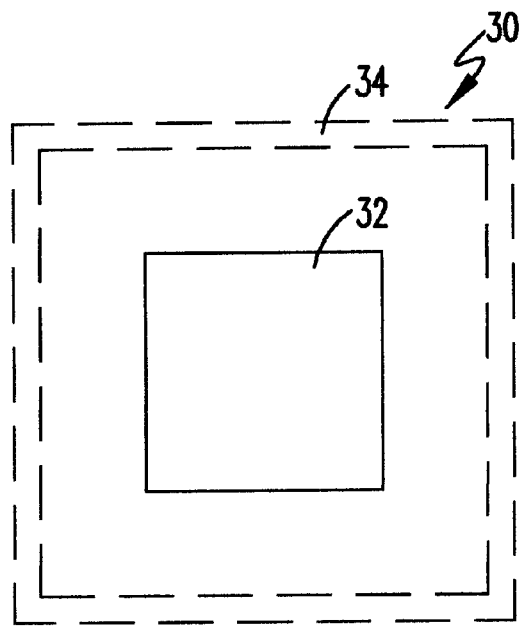
FIG. 3 is a plan view of a developed resist pattern after exposure with the mask pattern of FIG. 2.

When resist on a wafer is exposed using the pattern of FIG. 2 and the resist developed, the resulting pattern 30 is shown in FIG. 3. The exposure dose is somewhat critical to produce the contact hole pattern 32 while preventing the printing of artifact 34. However, either a standard or hybrid resist can be used with appropriate adjustment of the exposure dose. Central contact hole feature 32 is directly exposed through mask opening 22 and receives supplementary illumination from the assist feature 26. Artifact 34 will only be illuminated due to the assist feature.

Further, the illumination of artifact 34 is attenuated since it is the narrow width of the assist feature which prevents it from being printed. That is, the width of the assist feature is much narrower than the exposing wavelength, causing high levels of diffraction and low levels of intensity at the substrate surface, resulting in an absence of a printed pattern for the SRAF while supplementary illumination of the contact hole feature 32 from the mask assist feature 26 is relatively concentrated. Thus, it is the narrow width of the assist feature which prevents it from being printed. Additionally, likelihood of effective exposure of the artifact 34 may be reduced since the dimensions of the assist feature are preferably very small and approaching if not exceeding the resolution limits of the exposure tool and/or the resist.

Therefore, contact hole pattern 32 can be printed while artifact 34 is not if the exposure dose is suitably regulated. That is, for a normal resist, the exposure doses for feature 32 and 34 must be on opposite sides of a nominal exposure threshold characteristic of the hybrid resist and the positive and negative tone responses thereof.

Figure 4:
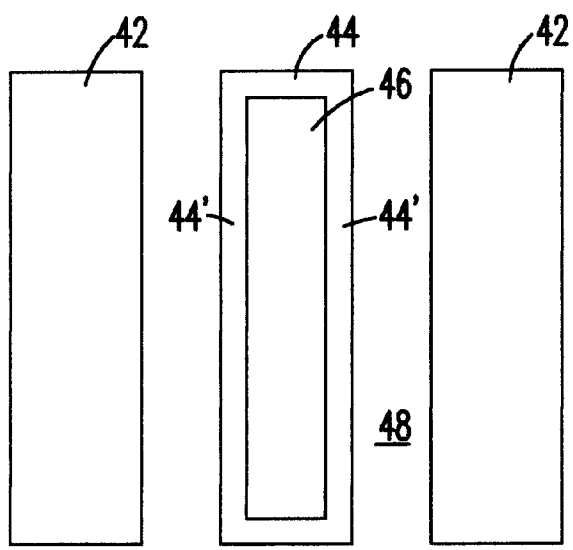
FIG. 4 is a plan view of an alternative embodiment of assist features employing the principles of the invention.

The principles of the invention as described above for scaling of contact holes can also be extended to the provision of multiple assist features between closely spaced features such as interconnects, as will now be described with reference to FIG. 4. As noted above, an increased number of assist features will effectively increase resolution and enhancement of feature imaging since the exposure dose from each assist feature will increase the exposure dose gradient at the edges of the feature. In the exemplary mask feature pattern of FIG. 4, elongated and closely spaced features 42 are the features of interest to be printed to a wafer using the mask. These features 42 are exposed on the mask using a reduced exposure dose such that only the positive tone portion of the hybrid resist response is triggered.

Then, to form the annular assist pattern 44, a further elongated shape is exposed at a higher exposure dose such that only the edges or fringes of the pattern where the exposure dose is reduced will produce effective exposure of the hybrid resist. Again, the central area 46 is produced by the higher exposure dose which triggers the negative tone response of the hybrid resist. Thus regions 44' of the assist feature will enhance imaging of the features 42 while the remainder of the assist feature 44 (at the ends thereof) generally will not produce or print artifacts as discussed above in connection with FIG. 3.

In view of the foregoing, it is seen that the invention provides a lithographic pattern and methodology capable of reliably scaling contact hole patterns or features to sizes comparable if not somewhat exceeding the minimum feature sizes of integrated circuit designs to 0.1 µm or less using a mask pattern including an assist pattern which can easily be produced in close proximity to each other. The exposure pattern for the mask is a simple annulus which can be defined by a very small amount of data and the contact hole pattern and the assist feature are simultaneously exposed on the mask, greatly reducing lithographic writing time. The mask in accordance with the invention can be used with any exposure medium.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An exposure pattern for a mask feature for lithographic patterning of a contact hole comprising
   an illuminated annulus including
      an inner edge for producing an intermediate level of illumination in an area of a hybrid resist corresponding to a feature and an outer edge for producing an intermediate level of illumination of said hybrid resist corresponding to an assist feature separated from said pattern area.

2. An exposure pattern as recited in claim 1, wherein said illuminated annulus is of sub-resolution width.

3. An exposure pattern as recited in claim 1, wherein said pattern area is a contact hole area.

4. An exposure pattern as recited in claim 1, wherein said pattern area is an elongated pattern.

5. An exposure pattern as recited in claim 4, wherein said elongated pattern is spaced from another elongated pattern.

6. A method of making a lithographic mask including steps of
   exposing a hybrid resist with an annular pattern having sub-resolution width, and
   developing said hybrid resist to form openings corresponding to a pattern area and an assist feature spaced from said pattern area.

7. A method as recited in claim 6, wherein said pattern area is a contact hole area.

8. A method as recited in claim 6, wherein said assist feature surrounds said pattern area.

9. A method as recited in claim 6, wherein said pattern area is an elongated pattern.

10. A method as recited in claim 9, wherein said elongated pattern is spaced from another elongated pattern.

11. A method as recited in claim 6, including a further step of exposing said pattern area of said hybrid resist with an exposure dose which is less than an exposure dose used in said step of exposing an annular pattern.

12. A method of forming an integrated circuit including steps of
   exposing a resist with a pattern including a feature corresponding to a pattern area of approximately minimum feature size of a given minimum feature size regime of said integrated circuit and a sub-lithographic assist feature formed using a hybrid resist spaced therefrom, and
   completing said integrated circuit.

13. A method as recited in claim 12, wherein said sub-lithographic assist feature surrounds said pattern area.

14. A method as recited in claim 13, wherein said pattern area is a contact hole.

15. A method as recited in claim 12, wherein said pattern area is one of a plurality of spaced elongated features and said sub-lithographic assist feature is adjacent an elongated side of said elongated feature.

16. A method as recited in claim 15, wherein said elongated feature is an interconnect.

17. A method as recited in claim 12, wherein a sub-lithographic assist feature is associated with each pattern area.

* * * * *